US011330747B2

(12) United States Patent
Jader et al.

(10) Patent No.: US 11,330,747 B2
(45) Date of Patent: May 10, 2022

(54) DISASSEMBLY APPARATUS

(71) Applicant: Data Security, Inc., Lincoln, NE (US)

(72) Inventors: Scott Jader, Lincoln, NE (US); Leroy Thiel, Lincoln, NE (US)

(73) Assignee: Data Security, Inc., Lincoln, NE (US)

( * ) Notice: Subject to any disclaimer, the term of this patent is extended or adjusted under 35 U.S.C. 154(b) by 85 days.

(21) Appl. No.: 16/845,758

(22) Filed: Apr. 10, 2020

(65) Prior Publication Data

US 2020/0329595 A1 Oct. 15, 2020

Related U.S. Application Data

(60) Provisional application No. 62/833,400, filed on Apr. 12, 2019.

(51) Int. Cl.
*H05K 13/04* (2006.01)
*H05K 13/08* (2006.01)

(52) U.S. Cl.
CPC ....... *H05K 13/0486* (2013.01); *H05K 13/082* (2018.08)

(58) Field of Classification Search
CPC ............. H05K 13/0486; H05K 13/082; Y10T 29/53274; Y10T 29/53283; Y10T 29/49815; Y10T 29/49822
USPC ......................................... 29/426.5, 762, 764
See application file for complete search history.

(56) References Cited

U.S. PATENT DOCUMENTS

| 5,375,318 A | * | 12/1994 | Catalano | H05K 13/0486 29/762 |
| 5,715,592 A | * | 2/1998 | Mori | H05K 13/0486 29/426.5 |
| 5,758,817 A | * | 6/1998 | Chapman | H05K 13/0486 228/19 |
| 5,829,694 A | * | 11/1998 | Chapman | C22B 11/025 241/79.1 |
| 6,672,496 B2 | | 1/2004 | Caster | |
| 9,682,451 B2 | | 6/2017 | Podges | |

OTHER PUBLICATIONS

"3300 QC Testing Package." Instron. 2013. Accessable at: https://www.instron.us/-/media/images/instron/catalog/products/testing-systems/universal-testing-systems/3300-universal/affordable/3300package_qc_na.pdf?la=en-us&hash=161482DA2CFC1D0023B0E5DBCF78401782D7B897.

(Continued)

*Primary Examiner* — Donghai D Nguyen
(74) *Attorney, Agent, or Firm* — Fitch, Even, Tabin and Flannery LLP

(57) ABSTRACT

An apparatus and method for dissembling electronic devices are described. The apparatus includes a housing with an aperture providing access to an interior thereof, and an adjustable support assembly positioned therein. The support assembly includes a first side plate and a second side plate with spacing in between, and a base plate for supporting an electronic device. A user interface is provided for receiving a user input, and in response to the user input, a motor is configured to drive a ram member downwards to contact and apply force to the electronic device held in the support assembly. A sensor may be included to measure the motor load current and output the measured load to an indicator to be viewed by a user for determining when a shell of the electronic device has been cracked.

12 Claims, 8 Drawing Sheets

(56) References Cited

OTHER PUBLICATIONS

"3300 Plastics Testing Package." Instron. 2013. Accessable at: https://www.instron.us/-/media/images/instron/catalog/products/testing-systems/universal-testing-systems/3300-universal/affordable/3300package_plastics_na.pdf?la=en-us&hash=E3422BF3A5F511432D2CD3A6869172C1ACF6453A.

"3300 Metals Testing Package." Instron. 2013. Accessable at: https://www.instron.us/-/media/images/instron/catalog/products/testing-systems/universal-testing-systems/3300-universal/affordable/3300package_metals_na.pdf?la=en-us&hash=91B4EF866A0F6BEB6923F7AE1E7E59D3DC9C9820.

\* cited by examiner

DISASSEMBLY APPARATUS

CROSS REFERENCE TO RELATED APPLICATIONS

This patent application claims the benefit of U.S. Provisional Patent Application No. 62/833,400 filed Apr. 12, 2019, which is incorporated by reference in its entirety as though fully rewritten herein.

TECHNICAL FIELD

This invention relates generally to a disassembly apparatus, and more specifically, an apparatus for disassembling electronic devices.

BACKGROUND

Electronic devices may be disassembled for various reasons, such as retirement or decommissioning. For example, such electronic devices may include cell phones, tablets, computer components, solid-state drives, among others. Upon disassembly, separation of various constituent components of the electronic device may be desired in order to segregate them as part of a recycling process. Specifically, separation of components such as circuit boards bearing nonvolatile memory devices for secure destruction is desired to ensure that the memory may no longer be accessed thereafter. Some standards for such secure destruction exist providing that disintegration of such memory devices must result in particles no larger than 2 mm.

Additionally, separating circuit boards at an initial point during disassembly provides certain advantages compared to disintegrating entire electronic devices in one step. For example, many electronic devices include power sources, such as batteries, that may pose certain health hazards if disintegrated in the same manner as the other components. In addition, the disintegration of components such as cases, glass display screens, and metal frames may impose wear and tear on expensive cutting blades utilized in typical disintegration devices. This can be avoided entirely by preliminary segregation of the circuit boards from the above-mentioned components. To do so, the housing or the shell of the electronic device may be opened to remove the desired components in a process colloquially referred to as "cracking."

Some disintegration devices are only structured to accommodate cracking of a single type of product. For example, automated devices for cracking an electronic device are known but are generally specifically designed to operate on a single form factor or product outline. To subsequently crack a different product, the device would require various modifications to, for example, the form, size, and placement of the form factor. Additionally, Apple, Inc. has disclosed a device for disassembling iPhone models that is capable of separating items as small as screws from other materials. However, again, the device is not configured to accommodate non-Apple brands nor larger devices such as tablets or solid-state drives.

Therefore, it would be beneficial to provide an apparatus and method for disassembling electronic devices and separating the circuit boards thereof that includes a single holding device that may be adjusted to accommodate electronic devices of ranging sizes and shapes. Additionally, it would be desirable to include a sensor for measuring the motor load of a motor used in the cracking operation and to output that measurement to an indicator for viewing by a user.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Generally speaking, in accordance with the present disclosure, an apparatus is provided for dissembling electronic devices. The apparatus includes a housing with an aperture providing access to an interior thereof, and an adjustable support assembly positioned therein. The support assembly includes a first side plate and a second side plate with spacing therebetween, and a base plate for supporting an electronic device. A user interface is provided for receiving a user input, and in response to the user input, a motor is configured to drive a ram member to contact and apply force to the electronic device held in the support assembly. A sensor may be included to measure the motor current load and output the measured load to an indicator to be viewed by a user for determining when a shell of the electronic device has been cracked.

Figure 1:
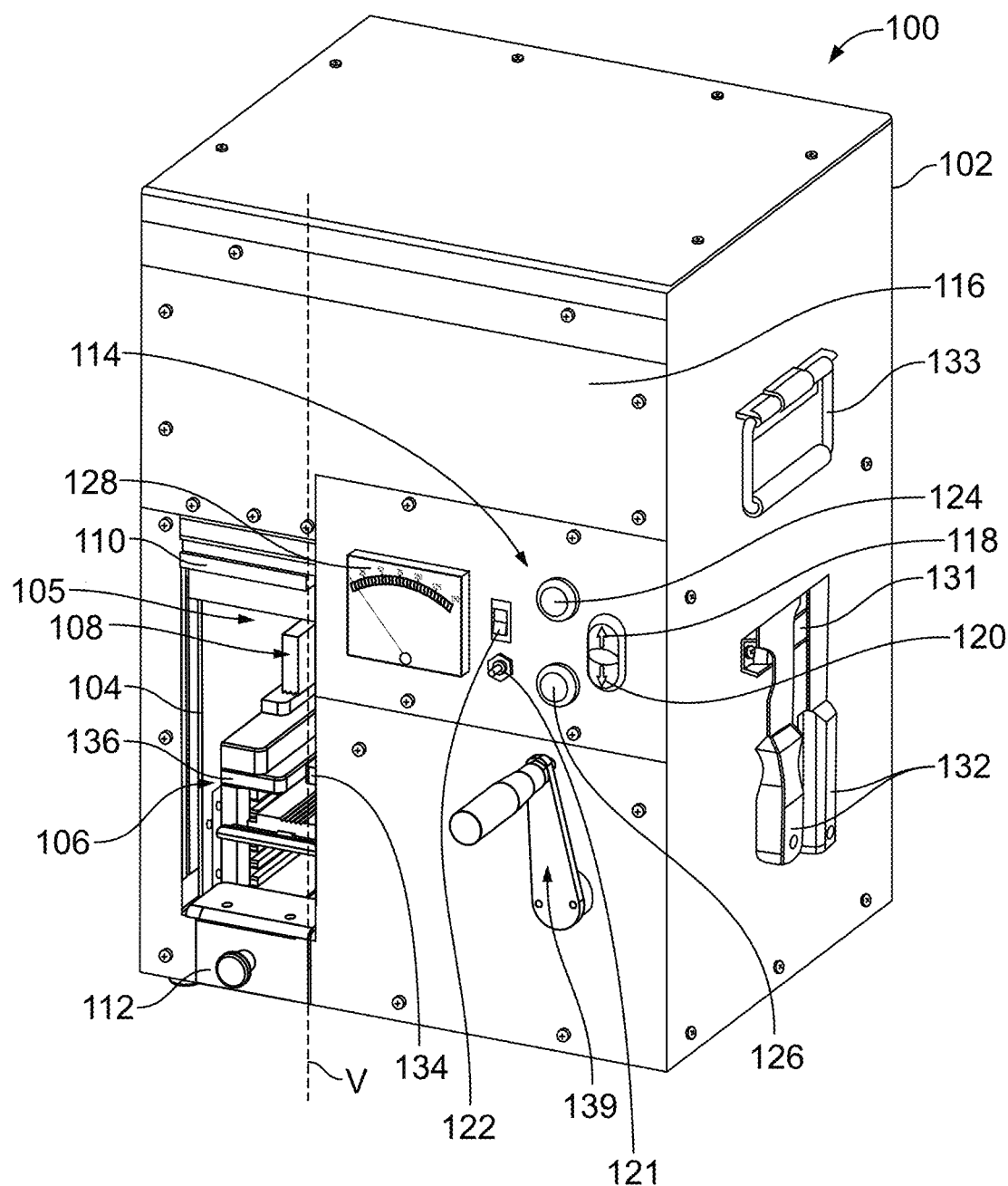
FIG. 1 is a perspective view of an example apparatus for disassembling electronic devices showing a housing, a support assembly positioned in an interior of the housing, a lever for adjusting the support assembly, and a user interface for controlling a ram member to crack an electronic device.

Referring now to FIG. 1, an example of such an apparatus 100 includes a housing 102 having an aperture 104 providing access to an interior 105 of the housing 102 is shown. As illustrated, a support assembly 106 is positioned in the interior 105 of the housing 102 and may be accessed by a user via the aperture 104. The support assembly 106 is configured to hold an electronic device such as a cellular phone, a tablet, a computer component, among others, as will be described in more detail hereinafter. A ram member 108 also positioned in the housing 102 may be advanced to apply force to the electronic device held in the support assembly 106, for instance, downwards in a vertical direction V. Such application of force to open the outer housing of the electronic device is typically referred to as a "cracking" operation. Thereafter, the internal components of the electronic device such as batteries and non-volatile memory may be removed and separately disposed.

The housing 102 is preferably formed of a durable material such as metal such that operation of the ram member 108 does not bend or otherwise buckle any portion of the housing 102 during a cracking operation due to the force applied to the electronic device. Additionally, the housing 102 may include various internal supports, such as internal strut 103 and internal walls 107, 107' (shown in FIG. 2) to improve stability. As illustrated, the housing 102 preferably includes a door, such as sliding door 110, to cover the aperture 104 during a cracking operation to inhibit egress of debris from interior 105. Additionally, a drawer 112 may be included proximate the bottom of the interior 105 of the housing 102 to catch any debris created during a cracking operation and facilitate removal thereof.

A user interface 114 is located on a front panel 116 of the housing 102 to control operation of the apparatus 100. As illustrated, the user interface 114 includes various push button switches and flip switches including, for example, an up push button 118 configured to cause the ram member 108 to raise, a down push button 120 configured to cause the ram member 108 to lower, and a power switch 122. Additionally, the front panel 116 may include one or more indicators configured to indicate an operating status of the apparatus 100 to the user. For example, a top indicator 124 may be an LED that is selectively energized upon the ram member 108 reaching an uppermost position thereof, and a bottom indicator 126 may include an LED that is selectively energized upon the ram member 108 reaching the lowermost position. Additionally, the front panel 116 may include a current indicator 128 configured to represent a current being applied to a motor 130 (shown in FIG. 2). The indicators 124, 126, push buttons 118, 120, power switch 122, and current indicator 128 may be located on other panels of the housing 102 or separately from the housing if connected by conventional wired or wireless ways. A motor protector 121 in the form of push button circuit breaker may also be provided to be actuated by the user for protecting the motor 130. In other embodiments, the front panel 116 may alternatively include a touch screen including both indicators and buttons for operating the apparatus 100.

As illustrated in FIG. 1, the housing 102 may further include one or more magnetic holders 131 to store accessories of the apparatus 100. For example, tools 132 may be provided attached to the magnetic holder 131 to assist in the separation of circuit boards and batteries from the housings of the electronic devices after a cracking operation. As shown, a handle 133 may be provided on both sides of the apparatus 100 to facilitate carrying thereof.

Figure 2:
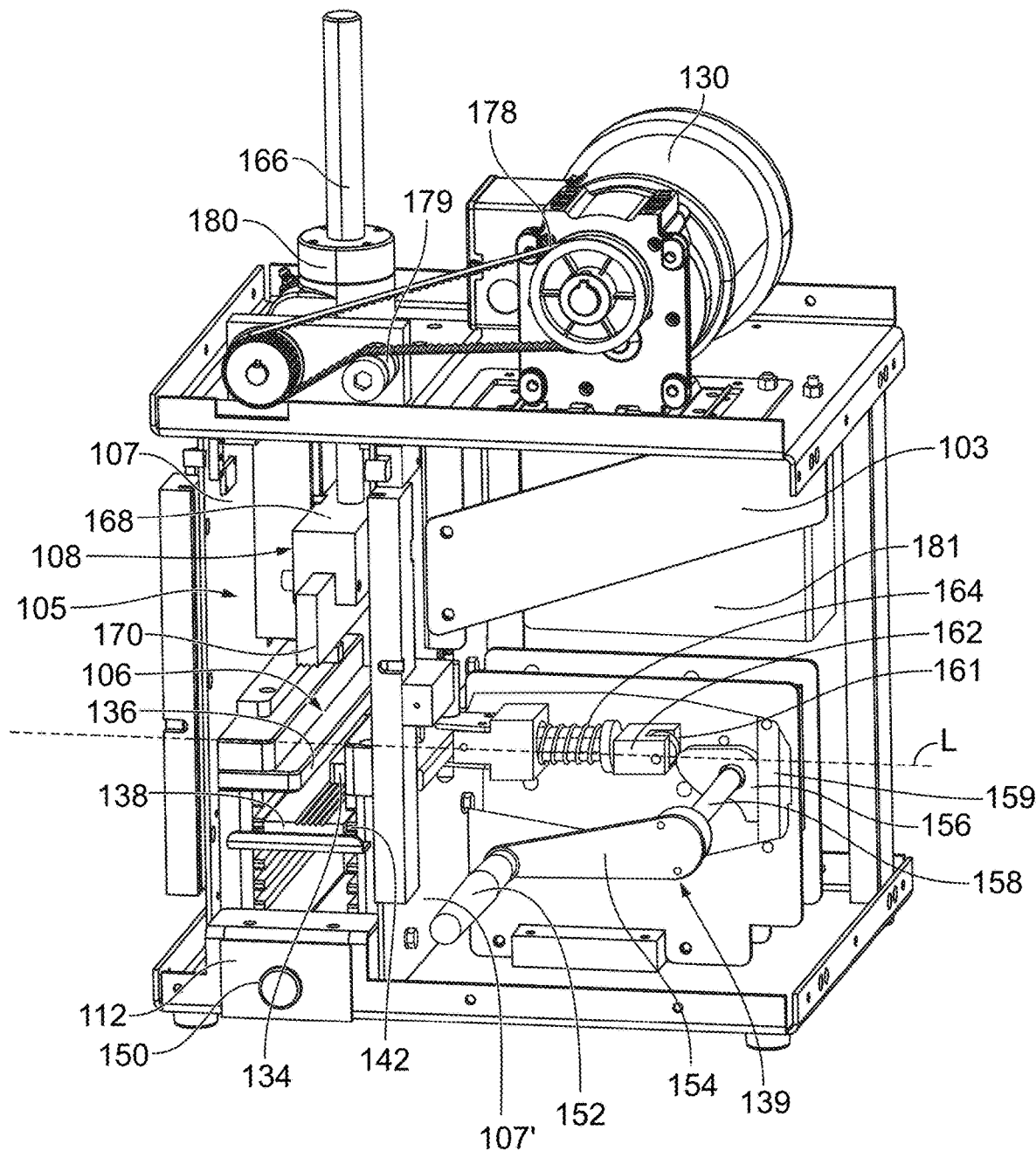
FIG. 2 is a perspective view of the apparatus of FIG. 1 with the housing removed to show interior components of the apparatus including a motor coupled to a screw jack via a drive train to cause movement of the ram member, the support assembly including a first side plate, a second side plate, and a base plate, and the lever coupled to an actuator via a cam to adjust spacing between the first and second side plates of the support assembly.

The support assembly 106 will be described in more detail with reference to FIGS. 2 and 3. For clarity, and due to electronic device variability, the figures do not illustrate the electronic device that may be placed in the support assembly 106. As shown in FIG. 2, the support assembly 106 includes a first side plate 134 and a second side plate 136 with spacing therebetween. The support assembly 106 further includes a base plate 138 located proximate the first and second side plates 134, 136. Preferably, at least one of the first and second side plates 134, 136 may be adjusted along lateral axis L such that the spacing therebetween may be adjusted. So configured, an electronic device may be placed on the base plate 138 and the spacing between the first and second side plates 134, 136 may be adjusted such that the electronic device is effectively clamped therebetween.

As illustrated, the first side plate 134 is adjustable via a lever 139, as will be described in more detail hereinafter. In other embodiments, both the first side plate 134 and the second side plate 136 may be symmetrically adjustable such that both side plates are configured to clamp inwards to secure the electronic device therebetween in synchronization. Additionally, the second side plate 136 may be of a stepped configuration such that the second side plate 136 comprises a plurality of connected plates having varying widths in the lateral direction L to accommodate electronic devices of varying sizes and shapes.

As illustrated in FIG. 2, the base plate 138 is positioned below the first and second side plate 134, 136 in the interior 105 of the housing 102 to function as a base support for the electronic device to be placed on. The base plate 138 is also adjustable to accommodate different sizes and configurations of electronic devices. The base plate 138 is preferably adjustable such that electronic devices having differing heights may be placed thereon in the interior 105 of the housing 102. As illustrated, the base plate 138 is formed as a tray configured to slide in and out of paired grooves 140 for adjustment. The grooves 140 may be marked with indicia corresponding with a plurality of different adjustment heights for reference during set up prior to a cracking operation. For example, the grooves 140 may be marked with letter such as "A" "B," "C," etc.

At a proximal end 142 of the base plate 138, a handle 144 is provided to facilitate withdrawal and insertion of the base plate 138 into the grooves 140. The handle 144 may be shaped such that the base plate 138 is inhibited from upside-down or reverse installation in the grooves 140. Preferably, a first side 146 of the base plate 138 includes a textured surface to inhibit movement of the electronic device that may be placed thereon. For example, as illustrated the first side 146 of the base plate 138 includes a plurality of jagged grooves 147. In other embodiments, the handle 144 may permit upside-down installation of the base plate in the grooves 138 and each side of the base plate 138 may be of a different texture. For example, the first side 146 of the base plate 138 may be textured and a second side (not shown) of the base plate 138 may be smooth to provide the user a selection depending on the electronic device selected to be cracked.

Figure 3:
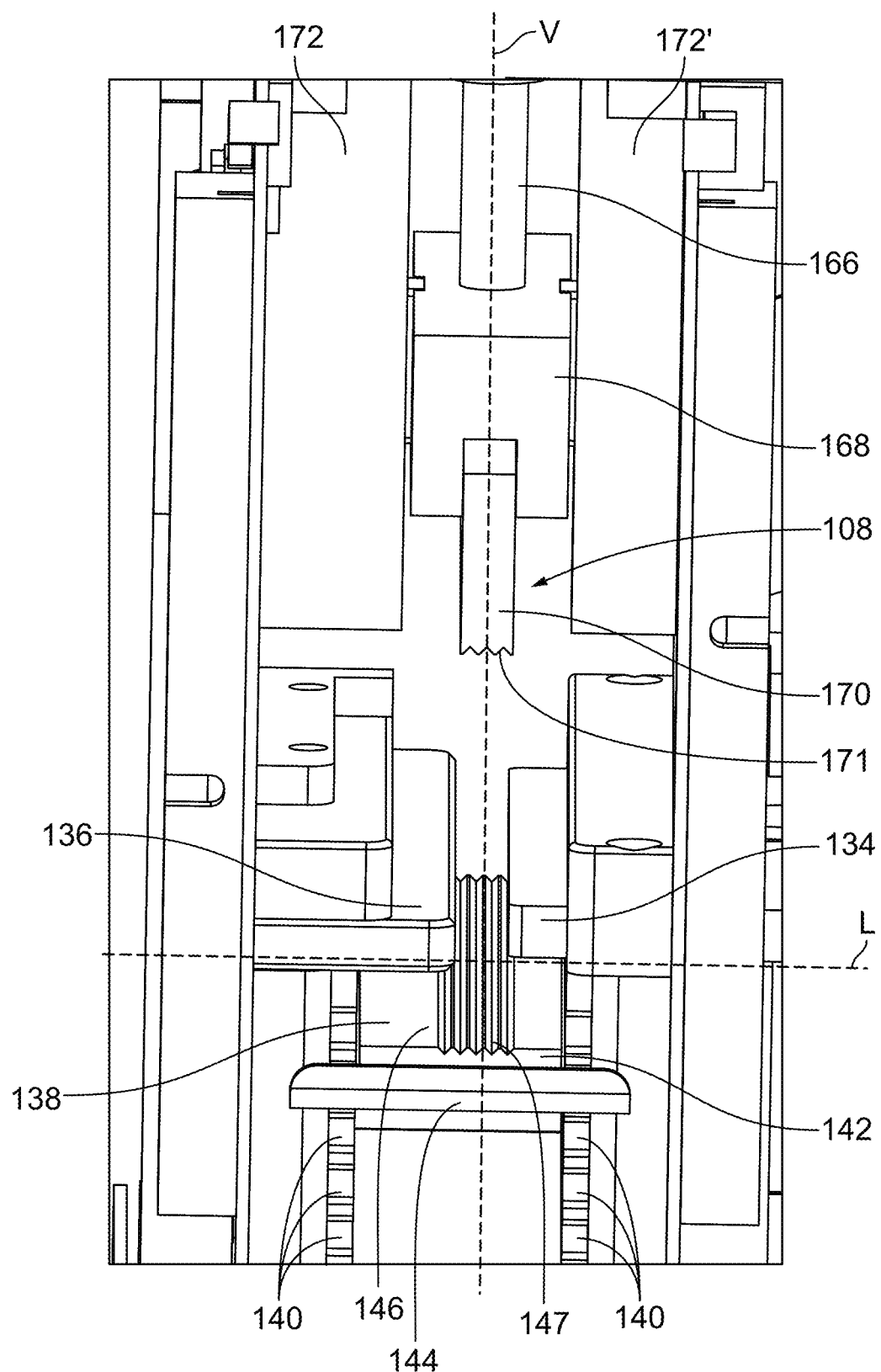
FIG. 3 is a front elevational view of the interior of the apparatus of FIG. 1 showing the ram member and the support assembly.

As shown in FIGS. 2 and 3, below the base plate 138 in the vertical direction V, the drawer 112 is positioned proximate the bottom of the interior 105 of the housing 102 to catch debris created during a cracking operation and facilitate removal thereof. The drawer 112 may be slidably positioned in the interior 105 such that it may be slidably removed to remove the debris via a handle 150 thereof.

Figure 4A:
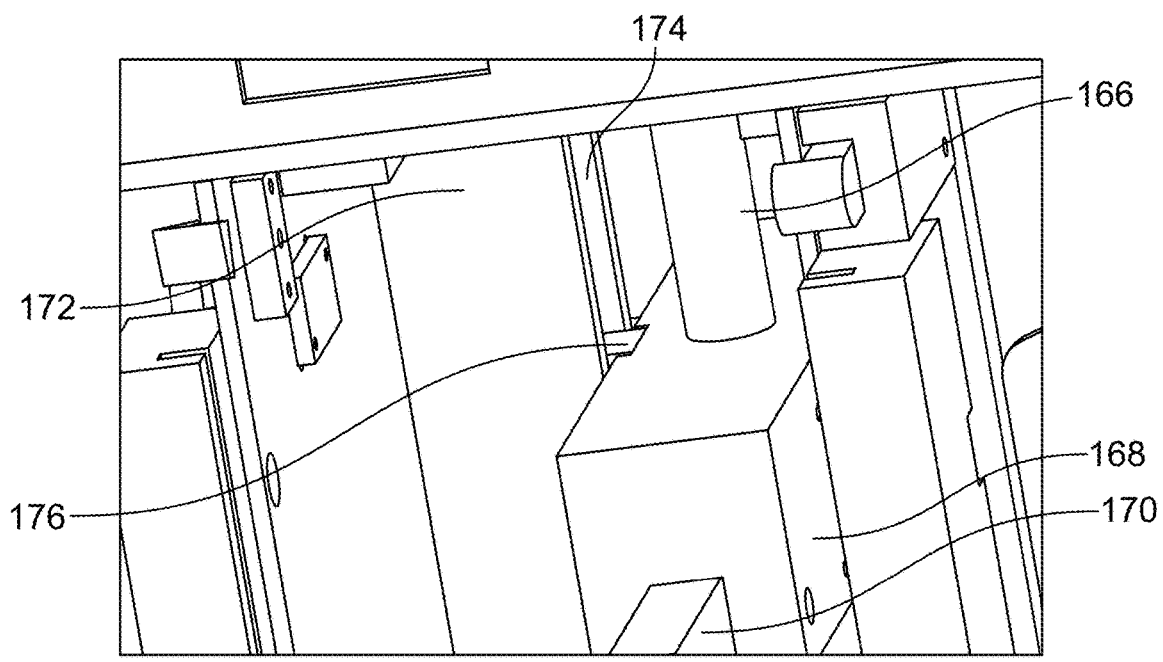
FIG. 4A is a right-side perspective view of the ram member of FIG. 3 showing a tab portion thereof slidably engaged in a channel of a guide.
Figure 4B:
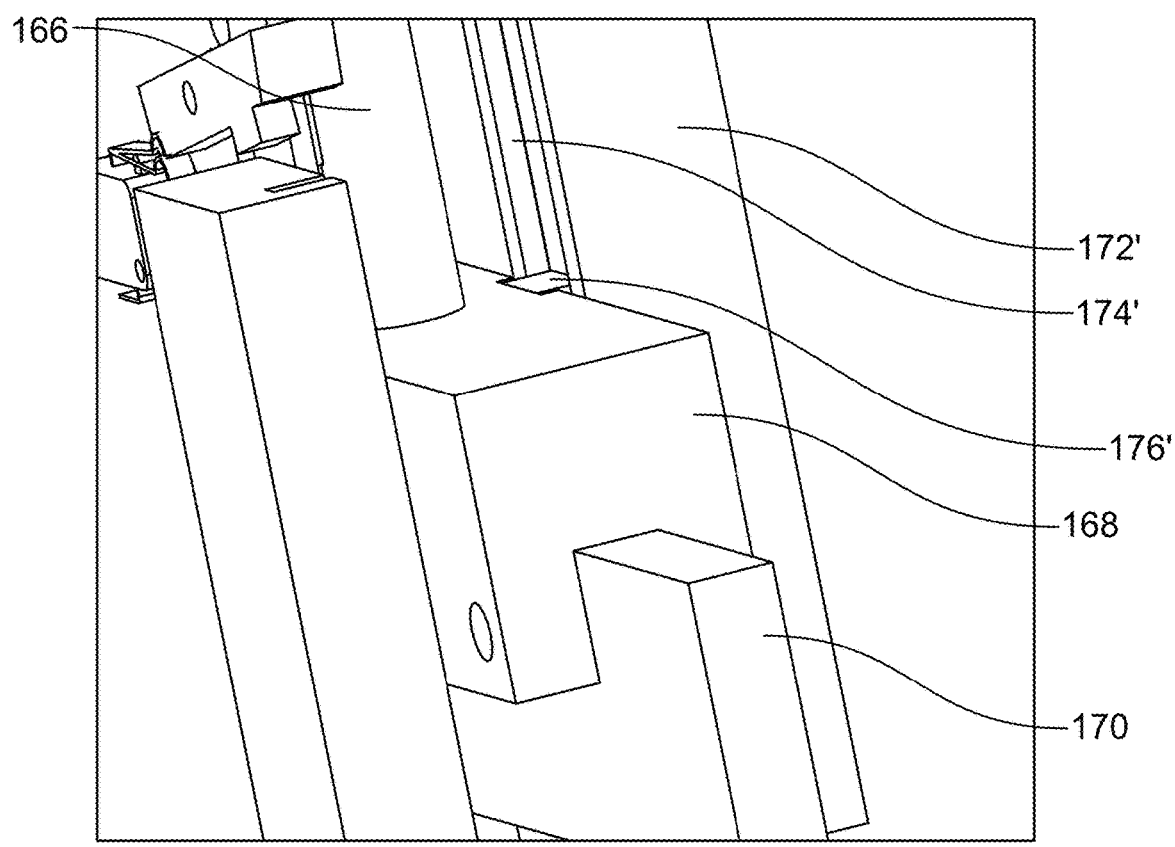
FIG. 4B is a left-side perspective view of the ram member similar to FIG. 4A, showing a tab portion on an opposite side thereof slidably engaged in a channel of a guide.

Referring now to FIGS. 2 and 3, the adjustable first side plate 134 of the support assembly 106 will now be discussed. As illustrated, the first side plate 134 may be moved via operation of lever 139 to adjust the spacing between the first side plate 134 and the second side plate 136. The lever 139 includes a handle portion 152 and an arm portion 154 to provide mechanical advantage for rotating the lever 139. The handle portion 152 may be coupled to the arm portion 154 via a hinge such that the handle portion 152 may be folded for compact storage thereof against the arm portion 154. As shown in FIGS. 2 and 4, the lever 139 is in an initial, unlocked position, and there is spacing between the first and second side plates 134, 136 of the support assembly 106 to position an electronic device therebetween. To clamp the electronic device between the first and second side plates 134, 136 to inhibit movement thereof, the lever 139 may be rotated counterclockwise. As shown in FIG. 2, the arm portion 152 of the lever 139 is coupled to a cam 156 via an elongate rod 158. The cam 156 is shown in a locked position whereby the cam 156 is inhibited from further rotation via abutment with a housing brace 159. The cam 156 acts on an actuator 162 including a spring 164 coupled to the first side plate 134 to move the first side plate 134 along the lateral axis L to clamp the electronic device between the first and second side plates 134, 136. The actuator 162 may include a rotating bearing 161 for contact with the cam 156 such that the contact therebetween is effectively smoothed. The spring 164 of the actuator 162 is configured to retract the first side plate 134 when the lever 139 rotates back to the unlocked position shown in FIG. 2. In other words, the spring 164 biases the first side plate 134 into a position providing spacing between the first and second side plates 134, 136. The actuator 162, spring 164, cam 156 and lever 139 form an over-center locking clamp. In other embodiments, the first side plate 134 may be adjustable by, for example, a turning knob or screw.

To perform the cracking of the electronic device, the ram member 108 is provided including a shaft portion 166, a holding portion 168 and a ram 170 that may be affixed to the holding portion 168 via, for example, threaded fasteners or the like. In some embodiments the shaft portion 166, the holding portion 168, and the ram 170 may be separate components that are assembled to form the ram member 108, and in other embodiments the ram member 108 may be formed of a monolithic one-piece construction. A bottom surface 171 of the ram 170 is configured to contact and apply force to the electronic device, and preferably is of a textured surface such as a plurality of grooves to grip the edge of the electronic device during cracking. During operation, the ram member 108 is configured to be advanced downwards in the vertical direction V along a predetermined pathway such that the ram 170 does not impact that first and second side plates 134, 136. As shown in more detail in FIGS. 4A and 4B, a pair of guides 172, 172' are positioned in the interior 105 of the housing 102 to inhibit lateral or longitudinal movement of the ram member 108 during cracking. The guides 172, 172' each include a channel 174, 174' corresponding with, and configured to receive, tab portions 176, 176' of the holding portion 168 such that the tab portions 176, 176' are slidably engaged with the channels 174, 174'.

The motor 130 is provided to drive the ram member 108. Power to the motor may be supplied by a power source (not shown) connected thereto via wires, connectors, traces or the like. For example, the motor 130 may be a split capacitor motor such as, for example, a Bison® 016-246 series gear motor. As shown in FIG. 2, the motor 130 is coupled to a drive train 178 for rotating a screw jack 180. The screw jack 180 may, for example, be a Joyce® WJ series screw jack. The drive train 178 is shown in the form of a timing belt engaged with a gear coupled to the motor 130 and a gear coupled to the screw jack 180 via a rod. Additionally, a tensioner 179 is provided that, in some embodiments, may be adjustable to adjust the tension of the timing belt. The gears coupled to the motor 130 and screw jack 180 may be of different sizes to alter the gear box to screw jack ratio to achieve desired force and speed of operation.

The screw jack 180 is configured to translate the rotational movement of the drive train 178 to vertical movement of the ram member 108 via, for example, a worm gear (not shown). The screw jack 180 in turn drives the shaft 166 of the ram member 108 downwards in the vertical direction V to cause the ram 170 to advance towards the electronic device clamped in the support assembly 106 via actuation of the lever 139. As the ram member 108 is advanced downwards, the tab portions 176, 176' slide in the channels 174, 174' inhibiting lateral or longitudinal movement of the ram member 108.

The power supplied to the motor 130 is selectively controlled via a contactor (not shown), preferably a reversing contactor, that may be positioned in box 181 and is electrically connected to the up push button 118 and the down push button 120. For example, the contactor may be an ABB VB series mechanically interlocked reversing contactor. Upon depression of the up or down push buttons 118, 120 the motor 130 causes the drive train 178 to move in either a forward or a reverse direction to cause the screw jack 180 to either move the ram member 108 up or down in the vertical direction V respectively. The motor 130 power rating and resulting force produced by the screw jack 180 and imparted on the shaft portion 166 of the ram member 108 are selected to preferably not stall the motor with tougher, more difficult to crack electronic devices. In some embodiments, the motor 130 may be allowed to operate briefly beyond its rated power before triggering an automatic shut off as described further hereinafter. Additionally, the user may continue to actuate the up and down push buttons 118, 120 multiple times to perform multiple cracking operation when the electronic device does not crack from the first application of force via the ram 170 thereto. In alternate embodiments, the disassembly device 100 may not include a motor 130 and may instead include a manually cranked ram using, for example, a hand crank.

Figure 5:
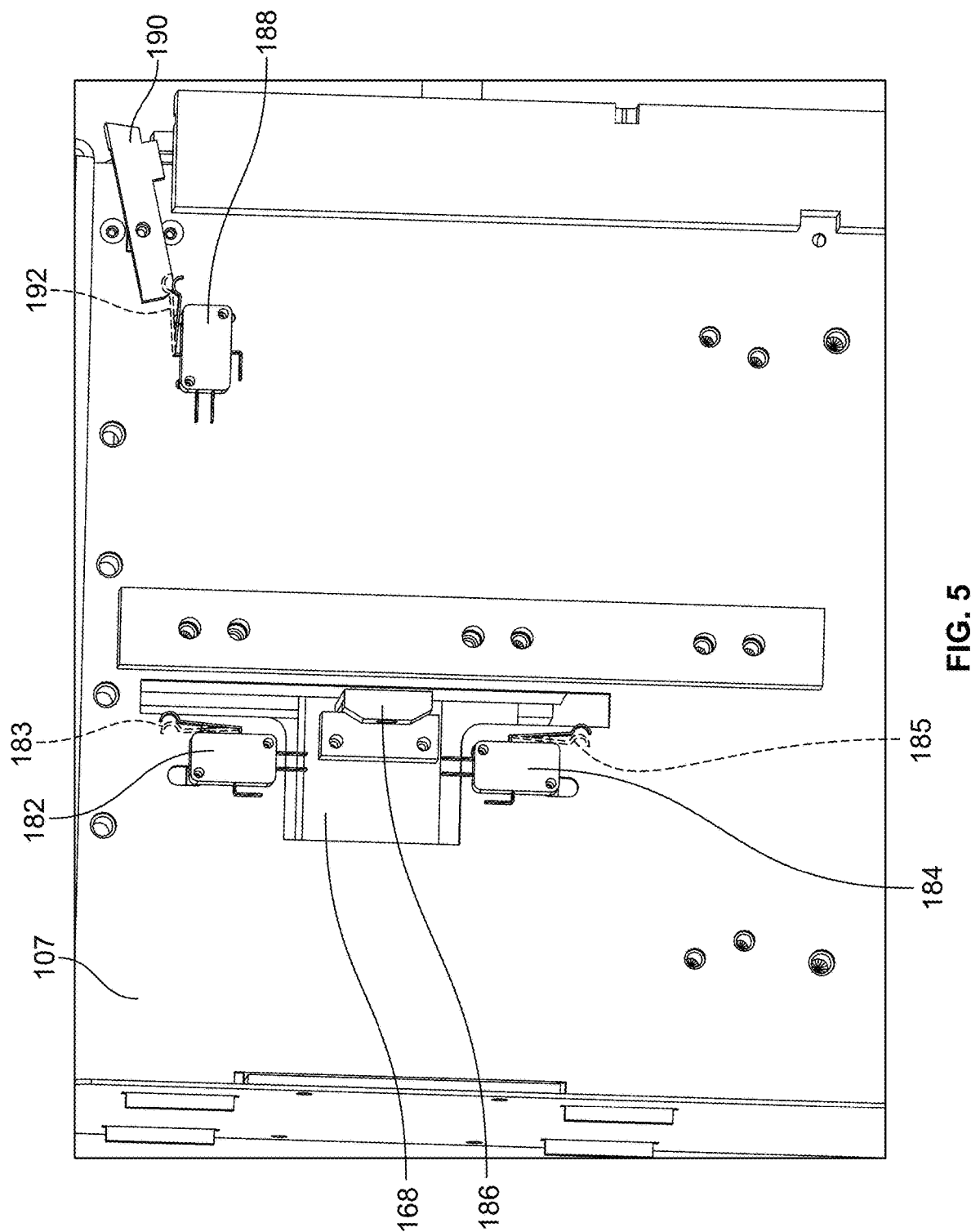
FIG. 5 is a left-side elevational view of the apparatus of FIG. 2 showing an upper limit switch, a lower limit switch, a door limit switch, and a protruding arm of the ram member positioned in a slot proximate the upper and lower limit switches.

In the illustrated embodiment, as shown in FIG. 5, the ram member 108 is inhibited from traveling beyond an upper limit and a lower limit in the interior 105 of the housing 102 via an upper limit switch 182 and a lower limit switch 184. The upper and lower limit switches 182, 184 are both electrically coupled to the contactor (not shown) via, for example, wires. A protruding arm 186 may be coupled to the ram member 108 at, for example, the holding portion 178 of the ram member 108, and configured to move integrally with the ram member 108 during a cracking operation. As illustrated, the protruding arm 186 moves in the vertical direction V in slot 187 of the internal wall 107. Upon reaching the upper limit switch 182, the protruding arm 186 contacts an actuator 183 of the upper limit switch 182, which opens the power circuit providing power to the motor 130 for driving the ram member 108 to inhibit further movement of the ram member 108 upwards. Similarly, the lower limit switch 184 includes an actuator 185, which opens the power circuit providing power to the motor 130 for driving the ram member 108 downwards upon contact with the protruding arm 186. So configured, the power to the motor 130 may be cut off via the upper and lower limit switches 182, 184 to inhibit the ram member 108 from traveling either above or below the predetermined limits respectively.

Additionally, the top indicator 124 and the bottom indicator 126 may be electrically connected to the upper and lower limit switches 182, 184 respectively such that upon actuation of the actuator 183 by the protruding arm 186, the LED of the top indicator 124 is energized and upon actuation of the actuator 185 by the protruding arm 185 the LED of the bottom indicator 126 is energized. So configured, the top and bottom indicators 124, 126 on the front panel 116 of the housing 102 may indicate to the user when the ram member 108 is at the lower limit or the upper limit thereof.

As described above, a sliding door 110 is provided to cover the aperture 104 during a cracking operation to inhibit egress of debris from interior 105 of the housing 102. The sliding door 110 may be of a substantially transparent material such that the user may visually watch the cracking operation, where being substantially transparent means either transparent or translucent enough to allow a user to be able to watch the cracking operation from outside with the sliding door 110 closed. Additionally, a door limit switch 188 may be provided, as shown in FIG. 5, as a failsafe to cut off power to the motor 130 in the event the sliding door 110 is opened during a cracking operation. For example, while the sliding door 110 is in an open position, a pivoting arm 190 may be engaged by the sliding door 110 to contact an actuator 192 of the door limit switch 188 to open the power circuit and cut off power to the motor 130. So configured, the power circuit providing power to the motor 130 may be opened thus preventing the ram member 108 from moving while the sliding door 110 is in an open position.

The disassembly device preferably includes a sensor 704 (FIG. 7), such as an ammeter calibrated to the motor rated current, that is configured to measure the motor load current of the motor 130. The sensor may be coupled to the current indicator 128 such that the current of the motor 130 may be displayed to a user throughout the cracking operation. For example, the current indicator 128 is shown in more detail in FIGS. 6A-6C. Other than to distinguish between lower current loads and higher current loads, the scale numbers and color ranges of the indicator 128 are of no consequence. A suitable feedback device for measuring motor load may be a Hoyt 2000 Series meter with Percent Motor Rated Current scales.

Figure 6A:
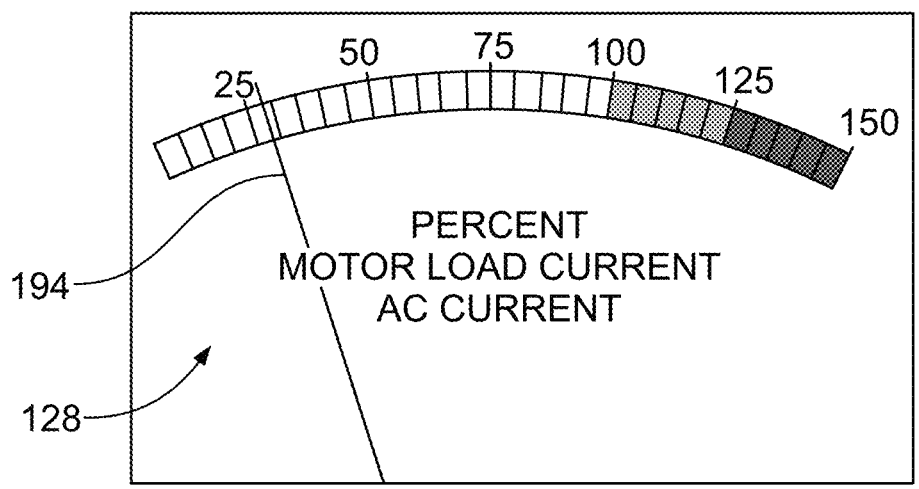
FIG. 6A is a front side view of a current indicator having a needle measuring motor load current during initial stages of a cracking operation.
Figure 6B:
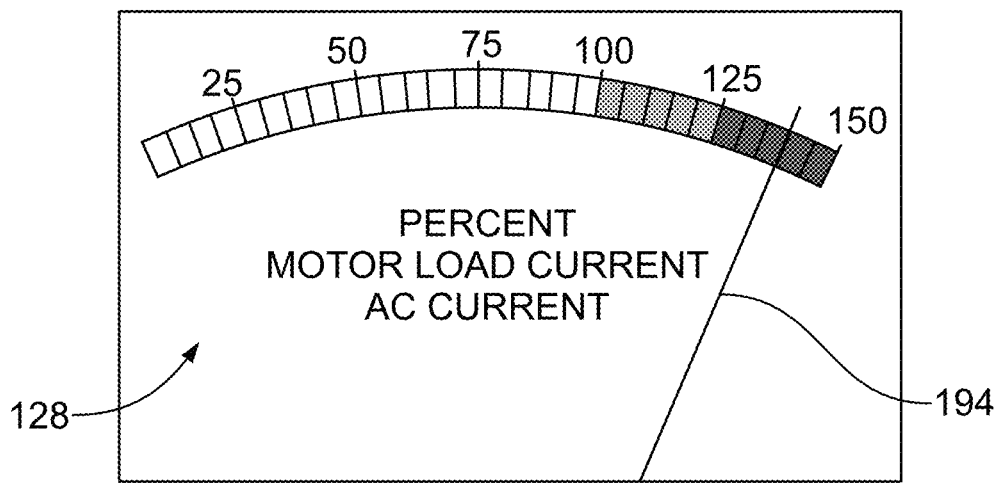
FIG. 6B is view similar to FIG. 6A, showing the needle measuring a peak motor load current when the ram member is in contact with the electronic device to be cracked.
Figure 6C:
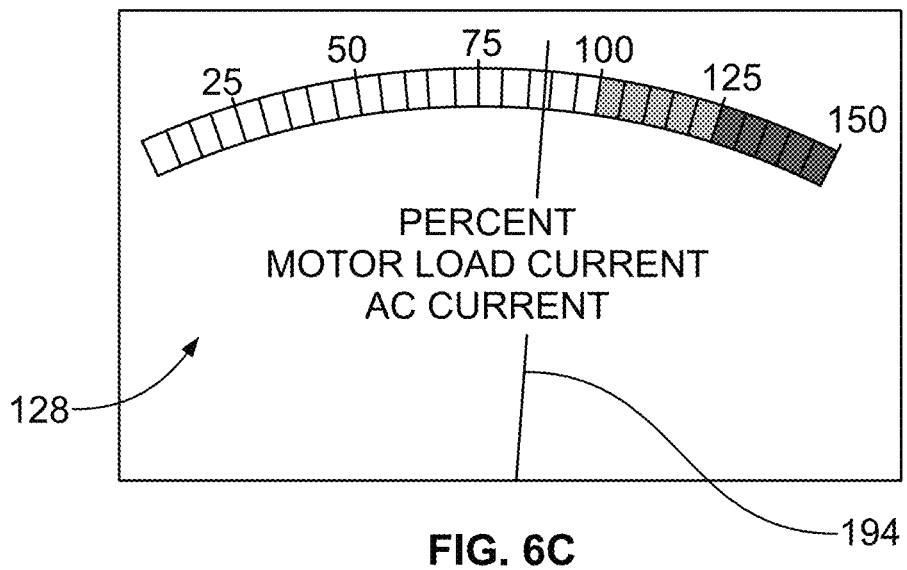
FIG. 6C is a view similar to FIG. 6A, showing the needle measuring motor load current after cracking of the electronic device via the ram member has occurred.

As shown in FIG. 6A, the needle 194 of the indicator 128 is responding to non-contact between the ram member 108 and the electronic device showing a low value corresponding to the friction of the drive train 178 before the ram member 108 has contacted the housing or shell of the electronic device. Once the ram member 108 contacts the electronic device, the needle 194 indicating the current load rapidly rises towards a peak such as the value indicated in FIG. 6B due to the increased motor load required to continue applying force to the electronic device via the ram 170. Once the housing or shell of the electronic device has been cracked, such that further downwards movement of the ram member 108 may damage a battery of the electronic device, the needle 194 of the indicator 128 quickly drops from the peak reading to a lower reading shown in FIG. 6C. So configured, the peak and subsequent drop of motor load serves as an end-of-process indication for the user such that the user can visually observe the indicator 128 and determine when the device has been sufficiently cracked and release the down push button 120. Additionally or alternatively, the user may watch the cracking operation via the translucent or transparent sliding door 110 to determine when cracking of the electronic device has occurred.

When the user does not end the process and cease actuation of the down push button 120 after the indicator 128 indicates that the peak load has dropped and sufficient cracking has occurred, the down limit switch 184 inhibits the ram member 108 from moving further downwards as described in greater detail above.

Figure 7:
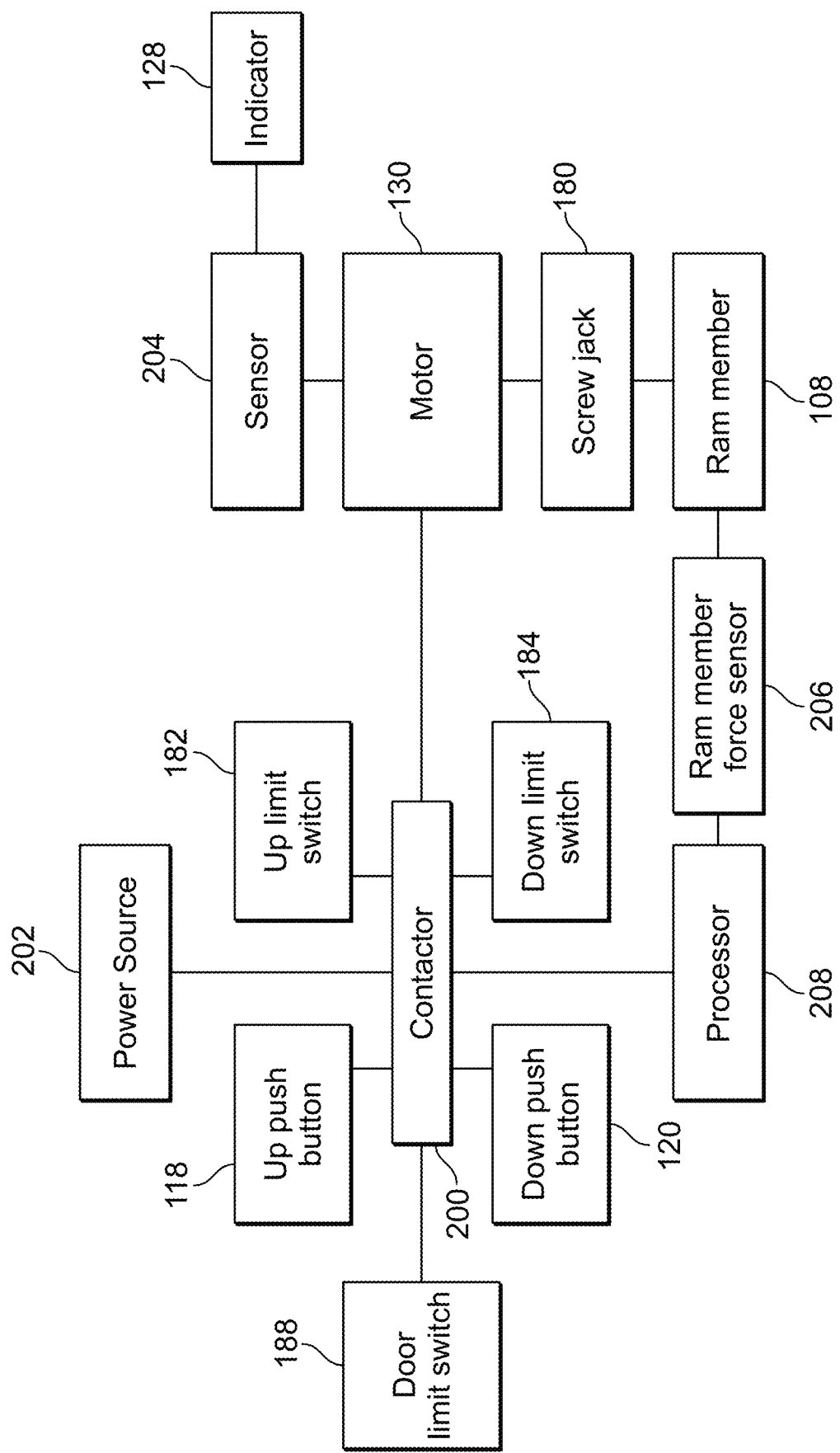
FIG. 7 is a schematic diagram of an example disassembly apparatus.

FIG. 7 shows a schematic diagram of the disassembly apparatus 100. As shown, the up and down push buttons 118, 120, door limit switch 188, and up and down limit switches 182, 184 are electrically coupled to the contactor 200 via wires, connectors, traces, or the like. Additionally, the contactor 200 is electrically coupled to power source 202, such as a connection to a standard wall outlet. The contactor 200 is electrically coupled to the motor 130 for selectively supplying power thereto from the power source 202. The motor 130 causes movement of the screw jack 180 via the drive train 170, and a sensor 204 is coupled to the motor 130 to measure a current load thereof and output the measured current load to indicator 128.

In some forms, the disassembly apparatus 100 may be configured to automatically perform the cracking operation and stop the cracking operation when a measured force applied by the ram member 108 exceeds a predetermined threshold. For example, the apparatus 100 can further include a ram member force sensor 206 connected to a processor 208 to detect a peak force and reverse the direction of the motor 130 when a load beyond a predetermined threshold is detected. Various electronic devices will crack under differing degrees of force depending on the material of the housing of the electronic device. If the motor 130 reaches a threshold load before the electronic device is cracked, the processor 208 may cause the motor 130 to reverse and prevent further operation of the ram member 108 which may otherwise damage the apparatus 100.

Additionally or alternatively, the processor 208 may be operatively coupled to a memory such that the user may store the operations of the disassembly apparatus 100, such as ram member 108 position and threshold force, for different models or makes of electronic devices. So configured, the user may select a specific make or model of electronic device, place the electronic device in the support assembly 106, close the sliding door 110, and begin the cracking operation by actuating a start button. Those skilled in the art will recognize and appreciate that processor 208 can comprise a fixed-purpose hard-wired platform or can comprise a partially or wholly programmable platform. All of these architectural options are well known and understood in the art and require no further description here. Upon the ram member force sensor 206 detecting the force typically required to crack the user selected model of electronic device, the processor 208 may be configured to cause the motor 130 to reverse to retract the ram member 108. So configured, the user need not manually operate the up and down push buttons 118, 120.

Figure 8:
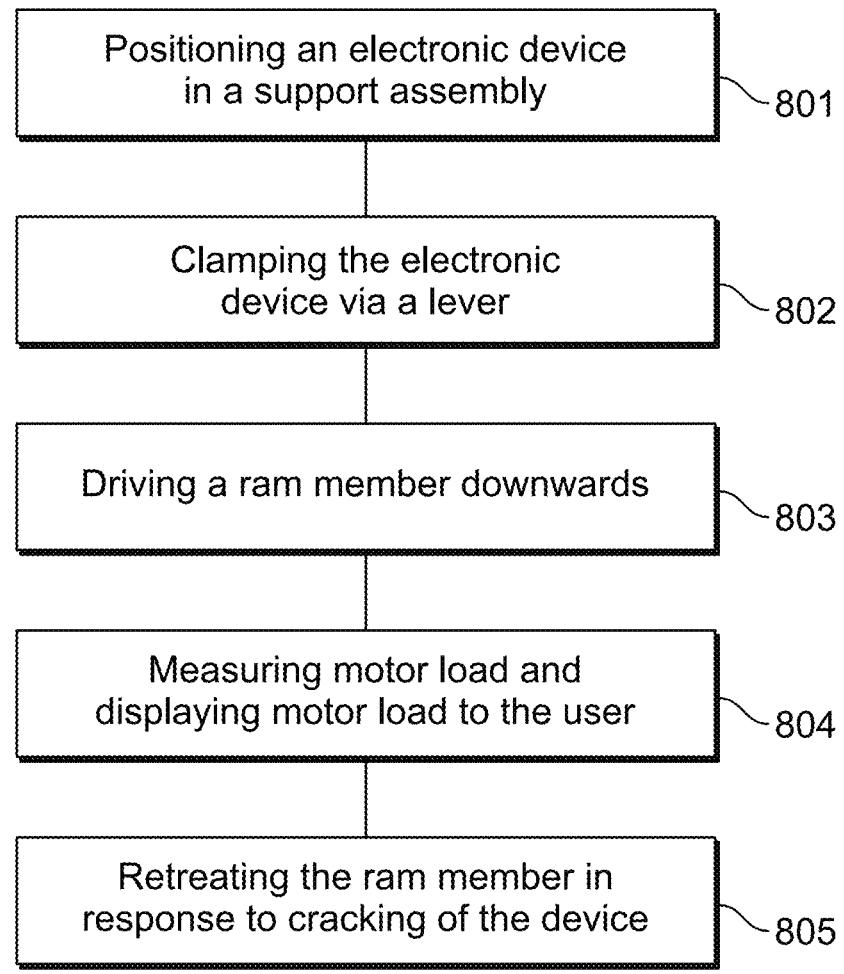
FIG. 8 is a flow chart of an example process for cracking an electronic device.

Typical operation of the disassembly apparatus 100 will now be described with respect to the flow chart shown in FIG. 8. In step 801, an electronic device such as a cellular phone may be placed on the base plate 138 of the support assembly 106 in the interior 105 of the housing 102. In step 802, the lever 139 may be actuated to rotate the cam 156 to move the actuator 162 along the lateral axis L to move the first side plate 134 and clamp the electronic device between the first side plate 134 and the second side plate 136 to inhibit movement of the electronic device during the cracking operation. Upon positioning the electronic device in the support assembly 106, the sliding door 110 may be closed, and the user may actuate the down push button 120 to cause the reversing contactor 200 to selectively power the motor 130 in step 803 to cause the drive train 178 to drive the screw jack 180. The screw jack 180 in turn drives the shaft portion 166 of the ram member 108 downwards in a vertical direction V until the ram 170 contacts the electronic device. At this point, in step 804, the indicator 128 connected to the sensor 204 will display the motor load current measured by the sensor 204. Once the housing or shell of the electronic device has been cracked, the user may cease actuation of the down push button 120 and press the up push button 118 to reverse operation of the motor 130 to cause the ram member 108 to return to the initial position in step 805. Upon returning to the initial position, the protruding arm 186 of the ram member 130 contacts the actuator 183 of the upper limit switch 182 and opens the power circuit to the motor 130 to cease operation of the motor 130 and energize the LED of the indicator 124 to indicate to a user that the cracking operation is completed and the sliding door 110 may be opened. The user may then disengage the lever 139 to increase spacing between the first and second side plates 134, 136 to remove the electronic device such that the internal components thereof, including the non-volatile memory and battery, may be separately disposed.

Uses of singular terms such as "a," "an," are intended to cover both the singular and the plural, unless otherwise indicated herein or clearly contradicted by context. The terms "comprising," "having," "including," and "containing" are to be construed as open-ended terms. Any description of certain embodiments as "preferred" embodiments, and other recitation of embodiments, features, or ranges as being preferred, or suggestion that such are preferred, is not deemed to be limiting. The disclosure is deemed to encompass embodiments that are presently deemed to be less preferred and that may be described herein as such. All methods described herein can be performed in any suitable order unless otherwise indicated herein or otherwise clearly contradicted by context. The use of any and all examples, or exemplary language (e.g., "such as") provided herein, is intended to illuminate the disclosure and does not pose a limitation on the scope of the disclosure. Any statement herein as to the nature or benefits of the disclosed device or of the preferred embodiments is not intended to be limiting. This invention includes all modifications and equivalents of the subject matter recited herein as permitted by applicable law. Moreover, any combination of the above-described elements in all possible variations thereof is encompassed by the disclosure unless otherwise indicated herein or otherwise clearly contradicted by context. No unclaimed language should be deemed to limit the invention in scope. Any statements or suggestions herein that certain features constitute a component of the claimed invention are not intended to be limiting unless reflected in the appended claims. Neither the marking of the patent number on any product nor the identification of the patent number in connection with any service should be deemed a representation that all embodiments described herein are incorporated into such product or service.

What is claimed is:

1. An apparatus for dissembling an electronic device, the apparatus comprising:
   a housing including an aperture, the aperture permitting access to an interior of the housing for insertion of the electronic device;
   a support assembly positioned in the interior of the housing, the support assembly including a first side plate, a second side plate, and a base plate, the first side plate and second side plate having a spacing therebetween;
   a motor operatively coupled to a ram member, the motor and ram member contained at least partially in the housing;
   a user interface configured to receive a user input; and
   wherein at least one of the first side plate and the second side plate is adjustable to adjust the spacing therebetween; and
   wherein the ram member is configured to be driven toward the support assembly by the motor in response to the user interface receiving the user input.

2. The apparatus of claim 1, further comprising a lever operatively connected to the first side plate of the support assembly, wherein rotation of the lever arm is configured to cause the first side plate to advance towards the second side plate to adjust the spacing therebetween.

3. The apparatus of claim 1, further comprising a sliding door covering the aperture of the housing and slidably engaged therewith.

4. The apparatus of claim 3, wherein the sliding door includes a substantially transparent window portion.

5. The apparatus of claim 3, further comprising a door limit switch to inhibit operation of the motor when the sliding door is in an open position.

6. The apparatus of claim 1, further comprising a removable tray positioned in the housing to receive debris of the electronic device.

7. The apparatus of claim 1, further comprising a sensor configured to detect motor load current of the motor and an indicator configured to indicate to a user a motor load detected by the sensor during operation of the driving motor and the ram member.

8. The apparatus of claim 7, further comprising a processor configured to compare the motor load current detected by the sensor to a threshold motor load current, the processor further configured to cause the motor to reverse operation upon the detected motor load current exceeding the threshold motor load current.

9. The apparatus of claim 1, wherein both the first side plate and the second side plate of the support assembly are adjustable in synchronization.

10. An apparatus for dissembling an electronic device, the apparatus comprising:
    a housing including an aperture, the aperture permitting access to an interior of the housing for insertion of the electronic device;
    a support assembly positioned in the interior of the housing, the support assembly including a first side plate, a second side plate, and a base plate, the first side plate and second side plate having a spacing therebetween, wherein at least one of the first side plate and the second side plate is adjustable to adjust the spacing therebetween;
    a motor operatively coupled to a ram member, the motor and ram member contained at least partially in the housing, wherein the ram member is configured to be driven toward the support assembly by the motor in response to the user interface receiving the user input;

a user interface configured to receive a user input; and a lever operatively connected to the first side plate of the support assembly, wherein rotation of the lever arm is configured to cause the first side plate to advance towards the second side plate to adjust the spacing therebetween;

a sliding door covering the aperture of the housing and slidably engaged therewith;

a door limit switch to inhibit operation of the motor when the sliding door is in an open position;

a sensor configured to detect motor load current of the motor and an indicator configured to indicate to a user a motor load detected by the sensor during operation of the driving motor and the ram member; and a processor configured to compare the motor load current detected by the sensor to a threshold motor load current, the processor further configured to cause the motor to reverse operation upon the detected motor load current exceeding the threshold motor load current.

11. The apparatus of claim 10, wherein both the first side plate and the second side plate of the support assembly are adjustable in synchronization.

12. The apparatus of claim 10, further comprising a removable tray positioned in the housing to receive debris of the electronic device.

* * * * *